(12) United States Patent
Sundberg et al.

(10) Patent No.: US 8,064,548 B2
(45) Date of Patent: Nov. 22, 2011

(54) ADAPTIVE MAXLOGMAP-TYPE RECEIVER STRUCTURES

(75) Inventors: Carl-Erik W. Sundberg, Sunnyvale, CA (US); Haralabos Papadopoulos, San Jose, CA (US)

(73) Assignee: NTT DoCoMo, Inc., Tokyo (JP)

( * ) Notice: Subject to any disclaimer, the term of this patent is extended or adjusted under 35 U.S.C. 154(b) by 735 days.

(21) Appl. No.: 12/121,634

(22) Filed: May 15, 2008

(65) Prior Publication Data
US 2008/0285671 A1   Nov. 20, 2008

Related U.S. Application Data

(60) Provisional application No. 60/930,815, filed on May 18, 2007.

(51) Int. Cl.
*H04L 27/06* (2006.01)
(52) U.S. Cl. .......... 375/341; 714/755
(58) Field of Classification Search .......... 375/267, 375/341; 714/755, 775, 796
See application file for complete search history.

(56) References Cited

U.S. PATENT DOCUMENTS

| | | | |
|---|---|---|---|
| 5,903,842 A | 5/1999 | Wang et al. | |
| 5,982,327 A | 11/1999 | Vook et al. | |
| 6,629,287 B1 * | 9/2003 | Brink ..................... | 714/755 |
| 6,804,307 B1 | 10/2004 | Popovic | |
| 6,862,552 B2 | 3/2005 | Goldstein et al. | |
| 7,042,858 B1 | 5/2006 | Ma et al. | |
| 7,072,295 B1 | 7/2006 | Benson et al. | |
| 7,095,812 B2 | 8/2006 | Chan | |
| 7,308,047 B2 | 12/2007 | Sadowsky | |
| 7,436,895 B1 | 10/2008 | Tujkovic | |
| 7,441,045 B2 | 10/2008 | Skene et al. | |
| 7,564,915 B2 | 7/2009 | Lee et al. | |
| 7,620,117 B2 | 11/2009 | Chae et al. | |
| 2002/0114404 A1 | 8/2002 | Aizawa et al. | |
| 2002/0176431 A1 | 11/2002 | Golla et al. | |
| 2003/0236080 A1 | 12/2003 | Kadous et al. | |
| 2004/0022179 A1 | 2/2004 | Giannakis et al. | |
| 2004/0116146 A1 | 6/2004 | Sadowsky et al. | |
| 2004/0165675 A1 * | 8/2004 | Ito et al. ................. | 375/267 |

(Continued)

FOREIGN PATENT DOCUMENTS

EP   1162750 A2   12/2001

(Continued)

OTHER PUBLICATIONS

Michalke, Clemens, et al., "Linear Momo Receivers vs. Tree Search Detection: A Performance Comparison Overview", IEEE Internatinal Symposium on Personal, Indoor and Mobile Radio Communications, Sep. 11, 2006, pp. 1-7.

(Continued)

*Primary Examiner* — David C. Payne
*Assistant Examiner* — Leon-Viet Nguyen
(74) *Attorney, Agent, or Firm* — Blakely, Sokoloff, Taylor & Zafman LLP (57) ABSTRACT

A method and apparatus is disclosed herein for adaptive MaclogMAP-type receiver structures. In one embodiment, a device comprises a receiver to receive information-bearing signals from the transmitter wirelessly transmitted using OFDM and bit interleaved coded modulation, and the receiver comprises an inner decoder structure having a multiple-in multiple-out (MIMO) joint demapper to perform most likely transmitted symbol estimation using a modified MaxLogMAP process that is operable to adapt a degree of metric correction based on quality of OFDM tones.

24 Claims, 4 Drawing Sheets

U.S. PATENT DOCUMENTS

| | | | |
|---|---|---|---|
| 2004/0205445 A1 | 10/2004 | Xu | |
| 2005/0010675 A1 | 1/2005 | Jaggi et al. | |
| 2005/0047514 A1 | 3/2005 | Bolinth et al. | |
| 2005/0068918 A1 | 3/2005 | Mantravadi et al. | |
| 2005/0111592 A1* | 5/2005 | Yee | 375/341 |
| 2005/0185707 A1 | 8/2005 | Hoo et al. | |
| 2005/0265280 A1 | 12/2005 | Roh et al. | |
| 2006/0002312 A1 | 1/2006 | Delattre et al. | |
| 2006/0020560 A1 | 1/2006 | Rodriguez et al. | |
| 2006/0029124 A1 | 2/2006 | Grant et al. | |
| 2006/0098760 A1 | 5/2006 | Shen et al. | |
| 2006/0146716 A1 | 7/2006 | Lun et al. | |
| 2006/0146791 A1 | 7/2006 | Deb et al. | |
| 2006/0148506 A1 | 7/2006 | Hoo | |
| 2006/0152391 A1 | 7/2006 | Effrps et al. | |
| 2006/0176945 A1* | 8/2006 | Li | 375/232 |
| 2007/0041475 A1 | 2/2007 | Koshy et al. | |
| 2007/0066229 A1 | 3/2007 | Zhang et al. | |
| 2007/0198899 A1* | 8/2007 | Yellin et al. | 714/776 |
| 2007/0281633 A1 | 12/2007 | Papadopoulos | |
| 2007/0286313 A1 | 12/2007 | Nikopour-Deilami et al. | |
| 2008/0025430 A1 | 1/2008 | Sadowsky | |
| 2008/0075022 A1 | 3/2008 | Lei et al. | |
| 2008/0123781 A1* | 5/2008 | Pisek et al. | 375/340 |
| 2008/0181339 A1 | 7/2008 | Chen et al. | |
| 2009/0225878 A1 | 9/2009 | Papadopoulos et al. | |

FOREIGN PATENT DOCUMENTS

| | | |
|---|---|---|
| EP | 1383246 A2 | 1/2004 |
| EP | 1411693 A2 | 4/2004 |
| EP | 1521386 A2 | 4/2005 |
| EP | 1530387 A1 | 5/2005 |
| EP | 1648097 A | 4/2006 |
| EP | 1648097 A2 | 4/2006 |
| EP | 1827040 A1 | 8/2007 |
| EP | 1863208 A1 | 12/2007 |
| GB | 2304495 | 3/1997 |
| GB | 2407007 A | 4/2005 |
| KR | 1020060063478 A | 6/2006 |
| WO | WO 01/43293 A1 | 6/2001 |
| WO | WO 2004/045167 A | 5/2004 |
| WO | WO 2004/025011 A | 7/2004 |
| WO | WO 2005/046081 A1 | 5/2005 |
| WO | WO 2006/029050 A | 3/2006 |
| WO | WO 2007/050860 A1 | 5/2007 |
| WO | WO 2007/073267 A1 | 6/2007 |
| WO | WO 2004/056011 A1 | 7/2007 |
| WO | WO 2007/087540 A2 | 8/2007 |
| WO | WO 2007/129990 A1 | 11/2007 |
| WO | WO 2008/057791 A1 | 5/2008 |
| WO | WO 2008/143973 A1 | 11/2008 |
| WO | WO 2009/033023 A2 | 3/2009 |
| WO | WO 2010/019618 A2 | 2/2010 |

OTHER PUBLICATIONS

Narayanan, K.R., et al., "Low Complexity Turbo Equalization with Binary Coding", IEEE International Conference on Communications, ICC '2000, New Orleans, pp. 1-5, vol. 1.

Hoeher, Peter, "Advances in Soft-Output Decoding", IEEE Global Telecommunications Conference, Nov.-Dec. 1993, pp. 793-797.

PCT International Search Report for PCT Patent Application No. PCT/US2009/035735, dated Jul. 13, 2009, 5 pages.

Written Opinion of the International Searching Authority for PCT Patent Application No. PCT/US2009/035735, dated Jul. 13, 2009, 8 pages.

US Office Action for U.S. Appl. No. 11/644,638, dated Sep. 30, 2010, 24 pages.

Korean Office Action for corresponding Korean Patent Application No. 2008-7025123, dated Sep. 29, 2010, 3 Pgs.

PCT International Preliminary Report on Patentability for PCT Patent Application No. PCT/US2009/035735, dated Sep. 16, 2010, 8 pages.

European Office Action for corresponding European Patent Application No. 07861675.2, dated Jul. 26, 2010, 4 pgs.

US Office Action for U.S. Appl. No. 11/754,903, dated Sep. 20, 2010, 18 pages.

US Office Action for U.S. Appl. No. 11/939,353, dated Sep. 22, 2010, 15 pages.

US Office Action for U.S. Appl. No. 11/644,638, dated Sep. 22, 2009, 13 pages.

PCT International Preliminary Report on Patentability for PCT Patent Application No. PCT/US2007/013074, dated Dec. 30, 2009, 8 pages.

PCT International Search Report for PCT Patent Application No. PCT/US2008/006287, dated Oct. 2, 2008, 6 pgs.

Written Opinion of the International Searching Authority for PCT Patent Application No. PCT/US2008/006287, dated Oct. 2, 2008, 7 pgs.

PCT International Preliminary Report on Patentability for PCT Patent Application No. PCT/US2008/065675, dated Dec. 17, 2009, 8 pages.

PCT International Search Report for PCT Patent Application No. PCT/US2009/054937, dated Dec. 30, 2009, 7 pgs.

Written Opinion of the International Searching Authority for PCT Patent Application No. PCT/US2009/054937, dated Dec. 30, 2009, 7 pgs.

Robertson, Patrick, et al., "A Comparison of Optimal and Sub-Optimal MAP Decoding Algorithms Operating in the Log Domain", Proceedings of the International Conference on Communications, Jun. 18, 1995, pp. 1009-1013, vol. 2, IEEE, New York, USA.

PCT International Search Report for PCT Patent Application No. PCT/US2009/56865, dated Mar. 2, 2010, 7 pgs.

Written Opinion of the International Searching Authority for PCT Patent Application No. PCT/US2009/56865, dated Mar. 2, 2010, 12 pgs.

PCT International Search Report for PCT Patent Application No. PCT/US2009/034758, dated Feb. 4, 2010, 7 pgs.

Written Opinion of the International Searching Authority for PCT Patent Application No. PCT/US2009/034758, dated Feb. 4, 2010, 7 pgs.

Sun, Sumei, et al., "Pseudo-Inverse MMSE Based QRD-M Algorithm for MIMO OFDM", Jan. 1, 2006, pp. 1545-1549, vol. 3.

Dai, Yongmei, et al., "A Comparative Study of QRD-M Detection and Sphere Decoding for MIMI-OFDM Systems", 2005 IEEE 16th International Symposium on Personal, Indoor and Mobile Radio Communications, Jan. 1, 2005, pp. 186-190.

US Final Office Action for U.S. Appl. No. 11/644,638, dated Apr. 29, 2010, 22 pages.

Korean Office Action for corresponding Korean Patent Application No. 2008-7023249, dated May 27, 2010, 4 Pgs.

European Office Action for corresponding European Patent Application No. 07862325.3, dated Jul. 6, 2010, 6 pgs.

PCT International Search Report for PCT Patent Application No. PCT/US2009/053472, dated Jun. 14, 2010, 7 pgs.

Written Opinion of the International Searching Authority for PCT Patent Application No. PCT/US2009/053472, dated Jun. 14, 2010, 5 pgs.

US Final Office Action for U.S. Appl. No. 12/040,653, dated Jun. 15, 2010, 40 pages.

PCT International Search Report dated Sep. 18, 2008, for PCT/US08/006286, filed May 16, 2008, 4 pages.

Written Opinion of the International Searching Authority dated Sep. 18, 2008, for PCT/US08/006286, filed May 16, 2008, 8 pages.

International Search Report mailed Nov. 6, 2008 for PCT/US08/065675, filed Jun. 3, 2008, 5 pages.

Written Opinion of the International Searching Authority mailed Nov. 6, 2008 for PCT/US08/065675, filed Jun. 3, 2008, 8 pages.

International Search Report for related application WO 08/048651, dated Jun. 25, 2008.

Written Opinion of the International Searching Authority for related application WO 08/048651, dated Jun. 25, 2008.

Communication Relating to the Results of the Partial International Search dated Jan. 31, 2009 for PCT/US07/13074, filed Jun. 1, 2007.

PCT International Search Report dated Apr. 14, 2008 for PCT/US07/23207, 3 pages.

Written Opinion of the International Searching Authority dated Apr. 14, 2008 for PCT/US07/23207, 6 pages.

International Search Report dated Apr. 15, 2008 for PCT/US07/24572, 4 pages.
Written Opinion of the International Searching Authority dated Apr. 15, 2008 for PCT/US07/24572, 6 pages.
PCT International Search Report dated Aug. 20, 2008 for PCT/US08/03274, 4 pages.
Written Opinion of the International Searching Authority dated Aug. 20, 2008 for PCT/US08/03274, 10 pages.
Lattice Semiconductor Corp., "Turbo Decoder", IP Data Sheet, 2003, 6 pages.
Kao, Chien-Yu, "A Bi-directional SOVA with Normalization for Turbo Decoding", Jun. 2006, Tainan, Taiwan, 72 pages.
Cox, Richard V., et al., "Subband Speech Coding and Matched Convolutional Channel Coding for Mobile Raido Channels", IEEE Transactions on Signal Processing, vol. 39, No. 8, Aug. 1991, pp. 1717-1731.
Hagenauer, Joachim, et al., "The Performance of Rate-Compatible Punctured Convolutional Codes for Digital Mobile Radio", IEEE Transactions on Communications, vol. 38, No. 7, Jul. 1990, pp. 966-980.
Lee, Inkyu, et al., "Code Design of Space-Time Bit-Interleaved Coded Modulation Systems for Maximum Diversity", ICC, Jun. 2004, 11 pages.
Taddei, Herve, et al., Mode Adaptive Unequal Error Protection for Transform Predictive Speech and Audio Coders, IEEE, 2002, pp. 165-168.
Higuchi, K., et al., "Adaptive Selection of Surviving Symbol Replica Candidates ased on Maximum Reliability in QRM_MLD for OFCDM MIMO Multiplexing", in Proc. Globecom, Dec. 2004, pp. 2480-2486.
Wong, K., "The Soft-Output M-Algorithm and Its Applications", PhD Thesis, Queens University, Kingston, Canada, Aug. 2006, 263 pages.
Noh, Y., et al., "Design of Unequal Error Protection for MIMO-OFDM Systems with Heirarchical Signal Constellations", Journal of Communications and Networks, vol. 9, No. 2, Jun. 2007, pp. 167-176.
Seshadri, N., et al., "List Viterbi Decoding Algorithms with Applications", IEEE Transactions on Communications, vol. 42, No. 2/3/4, Feb./Mar./Apr. 1994, pp. 313-323.
Taoka, H., et al., "Field Experiments on Ultimate Frequency Efficiency Exceeding 30 Bit/Second/Hz Using MLD Signal Direction in MIMO-OFDM Broadband Packet Radio Access", Proceedings of IEEE Conference on Vehicular Technology, Apr. 2007, pp. 2129-2134.
Kawai, H., et al., "Independent adaptive control of surviving symbol replica candidates at each stage based on minimum branch metric in QRM-MLD for OFCDM MIMO multiplexing", IEEE Vehicular Techonology Conference, VTC2004, vol. 3, Sep. 2004, pp. 1558-1564.
Wong, K.K.Y., et al., "Low-complexity space-time turbo equalizer with the soft-output M-algorithm for frequency-selective channels", IEEE International Conference on Communications, vol. 4, May 2005, pp. 2251-2255.
Wong, K.K.Y., et al., "Bi-directional soft-output m-algorithm for iterative decoding", IEEE International Conference on Communications, vol. 2, Jun. 2004, pp. 792-797.
Kitty, K.Y. Wong, et al., "Soft-Output Trellis/Tree Iterative Decoder for high-order BICM on MIMO Frequency Selective Rayleigh Fading Channels", IEEE International Conference on Communications, Jun. 2006, pp. 4278-4284.
Papadopoulos, H., et al., "Wideband space-time coded systems with non-collocated antennas", Radio and Wireless Symposium, 2008 IEEE, Jan. 22, 2008, pp. 307-310.
Lee, Inkyu, et al., "Diversity Analysis for Space-Time, Bit-Interleaved Coded Modulation Systems", Korea University, Seoul, Korea, Jan. 2007.
Gencata, et al., "Virtual-topology adaptation for WDM mesh networks under dynamic traffic," Proceedings of IEEE Infocom 2002, vol. 1, Jun. 23, 2002, pp. 48-56.
Koetter, R., et al., "Beyond routing: an algebraic approach to network coding," Proceedings of IEEE Infocom 2002, vol. 1, Jun. 23, 2002, pp. 122-130.

Del Re, Enrico, et al., "Next-Generation Mobile Satellite Networks," IEEE Communications Magazine, vol. 40, No. 9, Sep. 1, 2002, pp. 150-159.
Ernest, P.H.H., et al., "An efficient algorithm for virtual topology reconfiguration in WDM optical ring networks," Proceedings of 10th Conference on Computer Communications and Networks, Oct. 15, 2001, pp. 55-60.
Fasolo, E., "Network coding techniques," www.cs.virginia.edu/{yw5s/Network%20coding.ppt, Mar. 7, 2004, pp. 1-14.
Chou, P.A., et al., "Network Coding for the Internet and Wireless Networks", www.eecs.umich.edu/systems/ChouSeminar.ppt, Mar. 28, 2006, pp. 1-29.
Ahlswede, R., et al., "Network Information Flow", IEEE Transactions on Information Theory, IT-46(4), Jul. 2000, pp. 1204-1216.
Ho, T., et al., "The Benefits of Coding Over Routing in a Randomized Setting", in the Proceedings of the International Symposium on Information Theory (ISIT), Jun. 2003, pp. 1-6.
Katti, S., et al., "XORs in the Air: Practical Wireless Network Coding", in the Proceedings of the ACM Special Interest Group on Data Communication (SIGCOMM), Sep. 2006, 12 pages.
Koetter, R., et al., "An Algebraic Approach to Network Coding", IEEE/ACM Transactions on Networking, vol. 11, No. 5, Oct. 2003, pp. 782-795.
Li, S. R., et al., "Linear Network Coding", IEEE Transactions on Information Theory, IT-49(2), Feb. 2003, pp. 371-381.
Chou, P.A., et al., "Practical Network Coding", 51st Allerton Conference on Communication, Control and Computing, Oct. 2003, 10 pages.
Jafarkani, H., "Space-Time Coding, Theory and Practice", Cambridge University Press, 2005.
Yiu, S., et al., "Distributed Block Source Coding", IEEE GLOBECOM 2005 Proceedings, Nov. 2005.
Su, W., et al., "Signal Constellations for Quasi-Orthogonal Space-Time Block Codes with Full Diversity", IEEE Transactions on Information Theory, Oct. 2004, pp. 2231-2347.
Jafarkani, H., "A Quasi-Orthogonal Space-Time Block Code", IEEE Transactions on Communications, Jan. 2001, 4 pages.
Tirkkonen, O. et al.: "Minimal Non-Orthogonality Rate 1 Space-Time Block Code for 3+ Transmit Antennas," IEEE 6th Int. Symp. Spread Spectrum Tech. and Appl., pp. 429-432, Sep. 2000, 4 pages.
Sharma, N. et al.: "Improved Quasi-Orthogonal Codes Through Constellation Rotation," IEEE Trans. Communications, pp. 332-335, Mar. 2003, 3 pages.
Wang, H. et al.: "Upper Bounds of Rates of Space-Time Block Codes from Complex Orthogonal Designs," IEEE Trans. Information Theory, pp. 2788-2796, Oct. 2003, 9 pages.
El Gamal, H. et al., "Distributed Space-Time Filtering for Cooperative Wireless Networks", GLOBECOM'03, Dec. 2003, pp. 1826-1830.
Sezgin, A., et al., "On EXIT-Chart Analysis of Coherent and Non-Coherent Space-Time Codes", Smart Antennas, 2004, pp. 49-56.
Horn, R.A., et al., "Matrix Analysis", Cambridge University Press, New York, 1994.
Tse, D., et al., "Fundamentals of Wireless Communication", Cambridge University Press, May 2005.
Stott, J.H., "The DVB Terrestrial (DVB-T) Specification and Its Implementation in a Practical Modem", Proceedings of the 1996 International Broadcasting Convention, IEEE Conference Publication No. 428, Sep. 1996, pp. 255-260.
Guerin, R., et al., "Quality-of-Service in Packet Networks: Basic Mechanisms and Directions", Invited Paper, Computer Networks, vol. 31, No. 3, Feb. 1999, pp. 1-16.
Zhang, H., "Service Disciplines for Guaranteed Performance Service in Packet-Switching Networks", in the Proceedings of the IEEE, vol. 83, No. 10, Oct. 1995, pp. 1-23.
Caire, G., et al., "Achievable Throughput of MIMO Downlink Beamforming and Limited Channel Information", Proceedings of IEEE PIMRC, Aug. 2007.
Medard, M., "The Effect upon Channel Capacity in Wireless Communication of Imperfect Knowledge of the Channel", IEEE Transactions on Information Theory, May 2000, pp. 935-945.
Marzetta, T.L., "How Much Training is Required for Multi-User MIMO?", ACSSC96, Asilomar Conference Oct. 2006.

Wiswanath, P., et al., "Sum Capacity of the Multiple Antenna Gaussian Broadcast Channel and Uplink-Downlink Duality", IEEE Transactions on Information Theory, Aug. 2003, pp. 1912-1923.

Peel, C.B., et al., "A Vector Pertrubation Technique for Near-Capacity Multi Antenna Multi User Communication, Part I: Channel Inversion and Regularization", IEEE Transactions on Communications, Jan. 2005, pp. 195-202.

Joham, M., et al., "Linear Transmit Processing in MIMO Communications Systems", IEEE Transactions on Signal Processing, Aug. 2005, pp. 2700-2712.

International Search Report dated Apr. 17, 2009 for PCT/US2008/076252, 5 pages.

Written Opinion of the International Searching Authority dated Apr. 17, 2008 for PCT/US2008/076252, 9 pages.

Osseiran, A., The Winner II Air Interface: Refined Spatial-Temporal Processing Solutions, Online Citation <https://www.ist.-winrier.org/WINNER2-Deliverables/D3.4.1.pdf>, Jan. 1, 2007, pp. 1-148.

Bandemer, B., et al., "Linear MMSE Multi-User MIMO Downlink Precoding for Users with Multiple Antennas", IEEE International Symposium on Personal, Indoor and Mobile Communications, Sep. 1, 2006, pp. 1-5.

CATT, "Non-codebook based pre-coding for E-UTRA TDD Downlink", 3rd Generation Partnership Project, Oct. 4, 2006, pp. 1-3.

Gomadam, K.S., et al., "Techniques for Multi-user MIMO with Two-way Training", IEEE International Conference on Communications, May 19, 2008, pp. 3360-3366.

Written Opinion of the International Searching Authority dated Apr. 30, 2009 for PCT/US2007/022189, 8 pages.

S. M. Alamouti, "A simple transmitter diversity scheme for wireless communications," IEEE Journal Selected Areas in Communications, pp. 1451-1458, Oct. 1998.

I. Lee, A. M. Chan, and C.-E. W. Sundberg, "Space-time bit-interleaved coded modulation for OFDM systems," IEEE Transactions on Signal Processing, pp. 820-825, Mar. 2004.

H. Lee, B. Lee, I. Lee, and C.-E. W. Sundberg, "A flexible space-time coding system with unequal error protection," Proceedings of Vehicular Technology Conference (VTC 2005), Stockholm, Sweden, May 2005.

A. Chindapol and J. A. Ritcey, "Design, analysis, and performance evaluation for BICM-ID with square QAM constellation in Rayleigh fading channels," IEEE Journal on Selected Areas in Communications, pp. 944-957, May 2001.

X. Li, A. Chindapol, and J. A. Ritcey, "Bit-interleaved coded modulation with iterative decoding and 8PSK signaling," IEEE Transactions on Communications, pp. 1250-1257, Aug. 2002.

I. Lee and C.-E. W. Sundberg, "Code construction for space-time bit-interleaved coded modulation systems," Proceedings of the IEEE International Conference on Communications (ICC '04), pp. 722-726, Jun. 2004.

I. Lee and C.-E. W. Sundberg, "Reduced Complexity receiver structures for Space-Time Bit-Interleaved Coded Modulation Systems," to appear in IEEE Transactions on Communications.

US Office Action for U.S. Appl. No. 11/873,248, dated Mar. 31, 2010, 18 pages.

Korean Office Action for corresponding Korean Patent Application No. 2008-7025915, dated Feb. 9, 2010.

PCT International Preliminary Report on Patentability for PCT Patent Application No. PCT/US2008/076252, dated Apr. 1, 2010, 9 pages.

PCT International Preliminary Report on Patentability for PCT Patent Application No. PCT/US2008/073646, dated Mar. 4, 2010, 6 pages.

Su, W., et al., "Two Generalized Complex Orthogonal Space-Time Block Codes of Rates 7/11 and 3/5 for 5 and 6 Transmit Antennas", IEEE Transactions on Information Theory, Jan. 2003, vol. 49, No. 1, pp. 313-316.

US Office Action for U.S. Appl. No. 12/040,653, dated Dec. 11, 2009, 33 pages.

PCT International Preliminary Report on Patentability for PCT Patent Application No. PCT/US2008/003274, dated Sep. 24, 2009, 10 pages.

PCT International Search Report for PCT Patent Application No. PCT/US2007/013074, dated Dec. 2, 2009, 8 pgs.

Written Opinion of the International Searching Authority for PCT Patent Application No. PCT/US2007/013074, dated Dec. 2, 2009, 8 pgs.

PCT International Search Report for PCT Patent Application No. PCT/US2009/046014, dated Nov. 27, 2009, 7 pgs.

Written Opinion of the International Searching Authority for PCT Patent Application No. PCT/US2009/046014, dated Nov. 27, 2009, 8 pgs.

Stiglmayr, Stephan, et al., "Adaptive Coding and Modulation in OFDM Systems using BICM and Rate-Compatible Punctured Codes", 7 pages.

G. J. Foschini, H. C. Huang, M. K. Karakayali, R. A. Valenzuela, and S. Venkatesart, "The value of coherent base station coordination," in Proceedings of the 39th Annual Conference on Information Sciences and Systems (CISS '05), The Johns Hopkins University, Baltimore, MD, USA, Mar. 2005.

Yiu, S., et al., "Distritbuted Space-Time Block Coding for Cooperative Networks With Multiple Antenna Nodes", Computational Advances in Multi-Sensor Adaptive Processing, Dec. 13, 2005, pp. 52-55.

Yiu, Simon, et al., "Optimization of Distributed Space-Time Filtering", IEEE 62nd Vehicular Technology Conference, Sep. 2005, pp. 1829-1833, Piscataway, New Jersey, USA.

Adachi, Koichi, et al., "Iterative Modified QRD-M Based on CRC Codes for OFDM MIMO Multiplexing", IEICE Transactions on Communications, Jun. 1, 2007, pp. 1433-1443, vol. E90B, No. 6, Tokyo, Japan.

Detert, Thorben, "An Efficient Fixed Complexity QRD-M Algorithm for MIMO-OFDM using Per-Survivor Slicing", IEEE 4th International Symposium on Wireless Communications Systems, Oct. 1, 2007, pp. 572-576, Piscataway, New Jersey, USA.

US Final Office Action for U.S. Appl. No. 11/873,248, dated Sep. 1, 2010, 21 pages.

US Office Action for U.S. Appl. No. 11/939,353 dated Jan. 31, 2011, 15 pages.

Sen, et al., "Cute and jCUTE Concolic Unit Testing and Explicit Path Model-Checking Tool", Computer Aided Verification Lecture Notes in Computer Science, Jan. 1, 2006, pp. 419-423.

Majumdar, et al., "Hybrid Concolic Testing", IEEE 29th International Conference on Software Engineering, May 1, 2007, pp. 416-426.

PCT International Preliminary Report on Patentability for PCT Patent Application No. PCT/US2009/046014, dated Dec. 16, 2010, 9 pages.

PCT International Search Report for PCT Patent Application No. PCT/US2010/033549, Jan. 5, 2011, 5 pgs.

PCT Written Opinion of the International Searching Authority for PCT Patent Application No. PCT/US2010/033549, Jan. 5, 2011, 6 pgs.

European Office Action for European Patent Application No. 08767750.6, dated Jan. 12, 2011, 6 pgs.

PCT International Search Report for PCT Patent Application No. PCT/US2010/027139, Dec. 6, 2010, 5 pgs.

PCT Written Opinion of the International Searching Authority for PCT Patent Application No. PCT/US2010/027139, Dec. 6, 2011, 6 pgs.

European Office Action for European Patent Application No. 08767751.4, Jan. 14, 2011, 5 pgs.

Papadogiannis, et al., "A Dynamic Clustering Approach in Wireless Networks with Multi-Cell Cooperative Processing", IEEE International Conference on Communications, May 19, 2008, pp. 4033-4037.

PCT International Preliminary Report on Patentability for PCT Patent Application No. PCT/US2009/053466, dated Feb. 24, 2011, 9 pages.

PCT International Preliminary Report on Patentability for PCT Patent Application No. PCT/US2009/053471, dated Feb. 24, 2011, 9 pages.

PCT International Preliminary Report on Patentability for PCT Patent Application No. PCT/US2009/054937, dated Mar. 10, 2011, 8 pages.

PCT International Preliminary Report on Patentability for PCT Patent Application No. PCT/US2009/056865, dated Mar. 24, 2011, 12 pgs.

European Office Action for European Patent Application No. 07862325.3, Apr. 7, 2011, 6 pgs.

US Office Action for U.S. Appl. No. 12/209,110 dated Feb. 11, 2011, 20 pages.

US Office Action for U.S. Appl. No. 12/121,649, Apr. 19, 2011, 25 pgs.

US Office Action for U.S. Appl. No. 12/130,821, Feb. 22, 2011, 12 pgs.

US Office Action for U.S. Appl. No. 11/644,638, Apr. 15, 2011, 7 pgs.

European Office Action for European Patent Application No. 09718026.9, Feb. 10, 2011, 3 pgs.

European Office Action for European Patent Application No. 08756664.2, Mar. 17, 2011, 6 pgs.

* cited by examiner

```
┌─────────────────────────────────────────┐
│ Evaluate quality of individual OFDM tones received │
│   by a receiver in a wireless communication system │
│                    101                  │
└─────────────────────────────────────────┘
                     │
┌─────────────────────────────────────────┐
│ Perform a first decoding operation to produce a first │
│ set of output data representing most likely decision │
│ values for the transmitted bits and reliability values │
│ for these decisions, including performing decoding │
│ using a maxlogMAP on OFDM tones with quality │
│ higher than a first level, and perform decoding using │
│ a modified maxlogMAP algorithm on OFDM tones │
│ with quality below the first level by adding one or │
│ more correction terms to a maxlogMAP metric │
│                    102                  │
└─────────────────────────────────────────┘
                     │
┌─────────────────────────────────────────┐
│     Perform a second decoding operation │
│          with a binary outer coder      │
│                    103                  │
└─────────────────────────────────────────┘
```

ADAPTIVE MAXLOGMAP-TYPE RECEIVER STRUCTURES

PRIORITY

The present patent application claims priority to and incorporates by reference the corresponding provisional patent application Ser. No. 60/930,815, titled, "Adaptive MaxLog-MAP-type Receiver Structures for MIMO/OFDM/QAM Systems with BICM/ID," filed on May 18, 2007.

FIELD OF THE INVENTION

The present invention relates to the field of wireless communication; more particularly, the present invention relates to adaptive MaxLogMAP-type receivers.

BACKGROUND OF THE INVENTION

Future wireless systems require a more effective utilization of the radio frequency spectrum in order to increase the data rate achievable within a given transmission bandwidth. This can be accomplished by employing multiple transmit and receive antennas combined with signal processing. A number of recently developed techniques and emerging standards are based on employing multiple antennas at a base station to improve the reliability of data communication over wireless media without compromising the effective data rate of the wireless systems. So called space-time block-codes (STBCs) are used to this end.

Specifically, recent advances in wireless communications have demonstrated that by jointly encoding symbols over time and transmit antennas at a base station one can obtain reliability (diversity) benefits as well as increases in the effective data rate from the base station to each cellular user per unit of bandwidth. These multiplexing (throughput) gain and diversity benefits depend on the space-time coding techniques employed at the base station. The multiplexing gains and diversity benefits are also inherently dependent on the number of transmit and receive antennas in the system being deployed, in the sense that they are fundamentally limited by the multiplexing-diversity trade-offs curves that are dictated by the number of transmit and the number of receive antennas in the system.

For high data rates and wideband transmission, the use of OFDM makes the equalizer unnecessary. With multilevel modems, coded modulation systems can easily be designed by means of an outer binary code, e.g., a convolutional code, and an interleaver in a so called bit-interleaved coded modulation (BICM) system.

In many emerging and future radio networks, the data for any particular cell user may be available to multiple base stations. Joint signaling from multiple base stations can readily extend the range/coverage of the transmission. Furthermore, viewing each of the base stations with data for a particular user as an element (or a group of elements in the case that multiple transmit antennas are present at each base station) of a virtual antenna array suggests using cooperative signal encoding schemes across these base stations to provide diversity benefits to the desired user. Since the encoded signals, however, are transmitted by spatially dispersed base-stations, they arrive at the receiver with distinct relative delays with one another, i.e., asynchronously. Although these relative delays can, in principle, be estimated at the receiver, they are not known (and thus cannot be adjusted for) at the transmitting base stations, unless there is relative-delay information feedback from the receiver to the transmitting base stations.

A large collection of STBCs have been proposed in recent years as a means of providing diversity and/or multiplexing benefits by exploiting multiple transmit antennas in the forward link of cellular systems. Of interest is the actual symbol rate of the STBC scheme, R, which is equal to k/t (i.e., the ratio of k over t). Full rate STBCs are STBCs whose rate R equals 1 symbol per channel use. Another important attribute of a STBC is its decoding complexity. Although the decoding complexity of the optimal decoder for arbitrary STBCs is exponential in the number k of jointly encoded symbols, there exist designs with much lower complexity. One such attractive class of designs, referred to as orthogonal space-time codes (OSTBCs), can provide full diversity while their optimal decoding decouples to (linear processing followed by) symbol-by-symbol decoding. Full rate OSTBCs exist only for a two transmit-antenna system. For three or more antennas, the rate cannot exceed 3/4 symbols/per channel use. This rate is achievable for N=3 and N=4 antennas. As a result, although the imposed orthogonality constraint yields simple decoding structures, it places restrictions in the multiplexing gains (and thus the spectral efficiencies and throughput) that can be provided by such schemes.

Many MIMO/OFDM systems exploit large-size QAM constellations and BICM/ID and have an inner MIMO detector block of high complexity.

A number of systems deployed for broadcasting common audio/video information from several base stations are exploiting coded OFDM transmission under the umbrella of the single frequency network concept. These systems employ a common coded OFDM based transmission from each of the broadcasting base-stations. The OFDM based transmission allows asynchronous reception of the multitude of signals and provides increased coverage. However, as all base-stations transmit the same coded version of the information-bearing signal, SFN (single frequency network) systems do not provide in general full transmit base-station diversity with full coding gains (some form of this diversity is available in the form of multi-path diversity, although limited since it is not coordinated). A scheme with an inner modified orthogonal STBC can be viewed as a method that provides the OFDM based benefits of a single frequency network while at the same time allowing the full transmit base-station diversity and frequency diversity to be harvested from the system by using distinct coordinated transmissions from distinct base stations together with bit-interleaved coded modulation.

A class of schemes that can provide large spectral-efficiencies and reliable transmission includes space-time bit-interleaved coded modulation systems with OFDM. These systems can provide spatial (transmit and receive antenna) diversity, frequency diversity and can cope with asynchronous transmission. Furthermore, by modifying the binary convolutional code to a block with rate compatible punctured convolutional codes, a flexible UEP system can be achieved. One drawback associated with such systems is that the near-optimum receiver can be quite complex (computation intensive). The necessary joint demapper unit (inner MAP or Max-LogMAP decoder) grows in complexity exponentially with the product of the number of transmit antennas and the number of bits per modem constellation point. As an example with 16 QAM (4 bits/symbol) and 4 transmit antennas, the complexity of the calculations in the inner decoder is proportional to $2^{4 \times 4} = 2^{16}$.

It is well known that the Gray mapper for the QAM constellations is a good choice for the noniterative decoder but not for the iterative decoder.

SUMMARY OF THE INVENTION

A method and apparatus is disclosed herein for adaptive MaclogMAP-type receiver structures. In one embodiment, a device comprises a receiver to receive information-bearing signals from the transmitter wirelessly transmitted using OFDM and bit interleaved coded modulation, and the receiver comprises an inner decoder structure having a multiple-in multiple-out (MIMO) joint demapper to perform most likely transmitted symbol estimation and provide soft output information using a modified MaxLogMAP process that is operable to adapt a degree of metric correction based on quality of OFDM tones.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PRESENT INVENTION

Embodiments of the present invention relate, in general, to adaptive receiver structures for receiving digital information over wireless systems having multiple transmit antennas and multiple receive antennas. The adaptive receiver structures have flexible and efficient MIMO joint demappers based on improved versions of the MaxLogMAP algorithm. An efficient method for upgrading the inner joint demapper (MIMO detector) from a conventional MaxLogMAP to an improved algorithm that is approaching MAP performance is also disclosed. Furthermore, by adapting to the quality of the OFDM tones by use of the number of correction terms, the number of iterations and allocations over time, an overall complexity allocation is achieved with improved efficiency and performance.

Embodiments of the present invention include reduced complexity receivers for systems that, for example, exploit intelligent wideband transmission of the information bearing signal over the multiple independently fading paths from each transmitting base station to a receiver, in such a way that it provides transmit base station diversity, the frequency diversity available in the transmission bandwidth, receive antenna diversity if multiple receive antennas are employed, and extended coverage. The present invention is applicable to space time coding schemes for both systems with collocated base stations and non collocated base stations. In one embodiment, for such schemes, space-time block codes (STBCs) are used to provide diversity in the forward link, in the case that a single base station with multiple transmit antennas is employed for transmission as well as OFDM-based BICM systems.

Embodiments of the present invention apply to systems with an inner STBC as described above but even more so to systems with no inner STBC. It applies particularly well to all MIMO/OFDM based systems using bit interleaved coded modulation (BICM) with iterative decoding (ID). For a low rate outer code, these systems have full space diversity. For a high rate code, high date rates can be achieved but there is a reduction in the degree of space diversity.

In one embodiment, wideband transmission based on OFDM, and bit-interleaved coded modulation with an outer binary code is used. Orthogonal frequency division multiplexing (OFDM) is used to achieve flexible wideband systems. Bit interleaved coded modulation, BICM, (at the transmitter) with iterative decoding, ID, (at the receiver) is used for efficiency. The inner joint demapper is employed adaptively based on the quality of the OFDM tones. The system can be used with or without an inner orthogonal space-time block code.

In the following description, numerous details are set forth to provide a more thorough explanation of the present invention. It will be apparent, however, to one skilled in the art, that the present invention may be practiced without these specific details. In other instances, well-known structures and devices are shown in block diagram form, rather than in detail, in order to avoid obscuring the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; electrical, optical, acoustical or other form of propagated signals (e.g., carrier waves, infrared signals, digital signals, etc.); etc.

Overview

A wireless communication system a first device (e.g., a base station) having a transmitter and a second device having a receiver (e.g., a mobile terminal) to receive information-bearing signals from the transmitter wirelessly transmitted using OFDM and bit interleaved coded modulation is described. In one embodiment, the communication system described herein is a coded modulation system that includes transmitters that apply space-time coding with bit-interleaved coded modulation that is combined with a multi-carrier OFDM modulation and receivers that apply OFDM demodulation with iterative demapping and decoding. The systems described herein have $N_t$ transmit antennas and $N_r$ receive antennas. Each of the $N_r$ receive antennas receives signals that are the sum of channel-distorted versions of the signals transmitted from the $N_t$ transmit antennas. Such coded modulation systems in accordance with the present invention may be advantageously employed in wireless local/wide area network (LAN/WAN) applications.

While the exemplary embodiment is described for space-time coding with bit-interleaved coded modulation, other types of coded modulation for space-time coding may be used. In addition, the exemplary embodiments are described for a mapping of the bit-interleaved coded data into symbols using QAM; however, other modulation schemes may be used, such as, for example, but not limited to phase-shift keying (PSK).

Generally, the receiver includes circuitry that estimates the values for the elements in channel response matrix $H_k$, and such estimates may be generated using periodic test (pilot) signals transmitted by the transmitter to the receiver. Such a priori information of the channel impulse response may also be generated via simulations. The matrix $H_k$ denotes the channel response over the kth OFDM tone and is a matrix of dimensions $N_r$ by $N_t$.

When combined with signal processing, multiple transmit and receive antennas can yield communication links with increased bandwidth efficiency (data rate), extended power efficiency (range), or both. Embodiments of the invention deals primarily with the forward link, i.e., the base-to-mobile transmission direction of transmission. Methods and apparatuses are disclosed for adaptive MaxLogMAP based receiver structures.

In one embodiment, the receiver has an inner decoder structure having a multiple-in multiple-out (MIMO) joint demapper to perform most likely transmitted symbol estimation using a modified MaxLogMAP process that is operable to adapt a degree of metric correction based on the quality of OFDM tones. The complexity of the MaxLogMAP detector grows exponentially with the number of transmit antennas ($N_t$) times the number of bits per constellation point (B). For small and moderate values of the product $N_tB$, exhaustive-type detectors like the near-optimum MaxLogMAP are feasible. In one embodiment, a method for adaptively improving the performance of the MaxLogMAP (based on channel estimates) is used that allows the performance of the improve detector to approach that of the optimum maximum aposteriori probability (MAP) detector.

Embodiments of receivers employing improvements to a basic MaxLogMAP algorithm are described herein. In the OFDM based systems described herein, there is one MIMO detector for every tone. The adaptivity in the allocation of degree of upgrades for these MaxLogMAP algorithms is achieved by an allocation of complexity based on the tone quality. In one embodiment, this is evaluated based on the signal level on that tone. In another embodiment, this is evaluated based on the SNR on that tone.

In one embodiment, the decoder structure of the receiver adapts to employ the basic MaxLogMAP algorithm or a modified version of the MaxLogMAP algorithm based on the tone quality. For tones of high quality (where "high" means quality higher that a predetermined threshold value), the decoder structure uses the MaxLogMAP since it is known to be asymptotically optimum for high SNRs. Thus, the MaxLogMAP is quite sufficient for these tones and little is to be gained by investing in upgrades for those tones. On the other hand, for tones with low signal level or low SNR, a MAP algorithm is expected to perform better than a MaxLogMAP. In one embodiment, in such a case, the decoder structure uses a MAP algorithm in which correction terms are added to the MaxLogMAP metric. In one embodiment, the addition of correction terms and their computation, and using them for a calculation of a modified log likelihood ratio value, may be performed in the same manner as described in Lin & Costello Jr., "Error Control Coding, Second Edition", Prentice Hall, New York, 2003. In one embodiment, the correction term is calculated using the K smallest distance values that are saved during the exhaustive distance-metric calculation (rather than keeping only the minimum distance term as is done in the MaxLogMAP). In one embodiment, the MAP for each bit computes reliability as follows: first all the sequence candidates are split into two sets: one set has the value 0 on the bit location of interest, and the other set has the value 1 on the same bit location. The MAP computes the difference of the logarithms of the sum of likelihoods of all the terms in the first set, and the logarithm of the sum of likelihoods of all the terms in the other set. The MaxLogMAP instead computes an approximation: the difference between the logarithm of the largest term in the first set and the logarithm of the largest term in the other set. The improved MaxLogMAP version uses the logarithm of the sum of the best K paths in the first set minus the logarithm of the sum of the best K paths in the other set. In general, the likelihoods (or metrics) for all the possible candidates need to be exhaustively computed, prior to the improved MaxLogMAP calculation. Although not necessary, these metric terms (a subset of which are used in each sum by an improved MaxLogMAP) can be efficiently computed in the manner described in N. Graef, J. S. Hammerschmidt and C-E. W. Sundberg, "A Low Complexity Max-Log-MAP Detector", February 2007. The use of more than one term in each sum (i.e., the use of an improved MaxLogMAP) leads to a performance improvement at the price of a small increase in complexity compared to the conventional MaxLogMAP. Note that the larger the K value, the better the performance and the higher the complexity. However, the performance benefits provided by using an increased value of K diminish with increased SNRs.

In one embodiment, the choice of the value of K is made adaptively based on the quality of the tones. In one embodiment, this is accomplished by use of a lookup table that has been a priori generated. Assuming that this adaptivity in K is based on SNR, the lookup table partitions the SNR axis into SNR ranges. In particular, the table provides the value of K that should be used for each of the SNR ranges. In one embodiment, it is used as follows: given channel estimates at the receiver on a given OFDM tone, an effective SNR value is computed, the SNR range that contains this SNR value is found, and a table lookup provides the corresponding value of K that is to be used by the inner decoder on that OFDM tone.

In one embodiment, the adaptivity may not only affect the choice of K, the number of correction terms to the log likelihood ratio, but also the number of iterative-receiver iterations (J) for a given tone. In yet another embodiment, the adaptivity may affect the allocation of K and/or I over time, i.e. successive OFDM symbols.

Note that the upgrade of the MIMO detector in principle works with any binary outer code. This code could be a turbo code, an LDPC code, a regular convolutional code or an RCPC code. The decoder for the outer code is preferably a soft in soft out (SISO) type decoder, for example a MAP. The outer decoder supplies soft information for the inner MIMO detector for the iterative decoding. One embodiment of such a receiver is described further below in FIG. 3. In such a transmission system with an iterative receiver, the rate of the outer code is a design parameter, which can be used to provide a large degree of diversity (low code-rate), or high throughput (high code-rate). Embodiments of the invention apply to all these cases.

Figure 1:
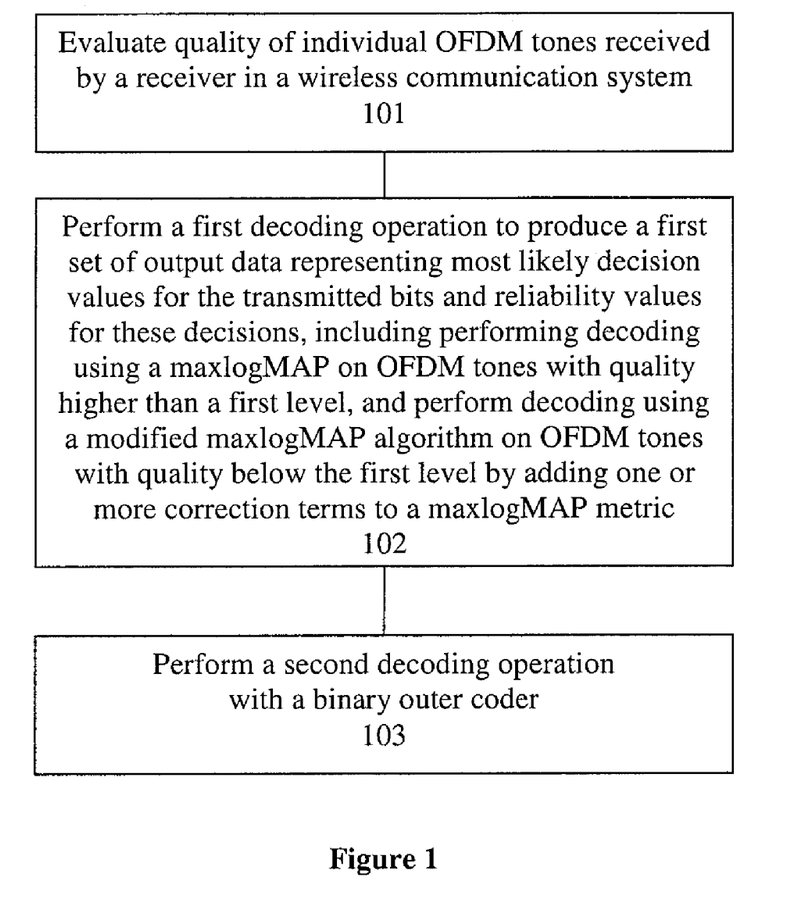
FIG. 1 is a flow diagram of one embodiment of a decoding process.

FIG. 1 is a flow diagram of one embodiment of a decoding process. The process may be performed by processing logic that may comprise hardware (e.g., dedicated logic, circuitry, etc.), software (such as is run on a general purpose computer system or a dedicated machine), or a combination of both. In one embodiment, the decoding process is preformed by a receiver in the wireless communication system.

Referring to FIG. 1, the process begins by processing logic evaluating quality of individual OFDM tones received by a receiver in a wireless communication system (processing block 101). The quality of the individual OFDM tones/sub-channels is evaluated/estimated at the receiver. In one embodiment, the quality of OFDM tones is based on signal level. In another embodiment, the quality of OFDM tones is based on signal-to-noise ratio (SNR).

After evaluating the quality of OFDM tones, processing logic performing a first decoding operation to produce a first set of output data representing most likely transmitted symbol estimation values and soft-output information, including performing decoding using a MaxLogMAP on OFDM tones with quality higher than a first level, and performing decoding using a modified MaxLogMAP algorithm on OFDM tones with quality below the first level by adding one or more correction terms to a MaxLogMAP metric (processing block 102). Thus, in one embodiment, for OFDM tones of good quality, i.e., high signal level or high signal to noise ratio (SNR), the regular MaxLogMAP is used since the MaxLogMAP is asymptotically optimum for large SNRs, and for OFDM tones of poor quality, i.e., low signal level or low SNR, a correction term is calculated and added. The choice of what is designated as "high" and what is designated as "low" is a matter of design based on relative signal levels. For instance, levels higher than a threshold value can be designated as "high" and the rest of the levels as low, and where the threshold can be a priori determined and stored in a lookup table.

In one embodiment, performing decoding using a modified MaxLogMAP algorithm comprising performing an exhaustive distance-metric calculation; maintaining a predetermined number of two or more smallest distance values during the exhaustive distance-metric calculation; and calculating a modified log likelihood ratio value using the predetermined number of smallest distance values. In one embodiment, performing decoding also includes selecting the predetermined number adaptively based on the quality of the OFDM tones.

After performing the first decoding operation, processing logic performs a second decoding operation with a binary outer coder (processing block 103). In one embodiment, the outer decoder is a decoder for the outer encoder. In the case the outer code is a convolutional code, the outer decoder can be, for instance, a MAP (BCJR) decoder or a MaxLogMAP decoder, or a soft-input hard-output Viterbi decoder in the non-iterative case. In general, the outer decoder may comprise one of the conventionaly used decoders for the associated outer encoder, including a rate-compatible punctured convolutional (RCPC) code, a turbo code and a LDPC code.

In one embodiment, the process further includes selecting the number of inner/outer decoder iterations for a given tone adaptively based on the quality of the individual OFDM tones. In another embodiment, the process further comprises adapting use of the one or more correction terms to compute and add to a MaxLogMAP metric to different OFDM blocks in a time sequence. In yet another embodiment, the process comprises adapting a number of iterations to different OFDM blocks in a time sequence.

In one embodiment, the process is non-iterative. In such a case, soft outputs are produced by an inner adaptive MaxLogMAP decoder and passed to a simpler outer decoder, which in this case only produces hard outputs.

Transmitter and Receiver Embodiments

Figure 2:
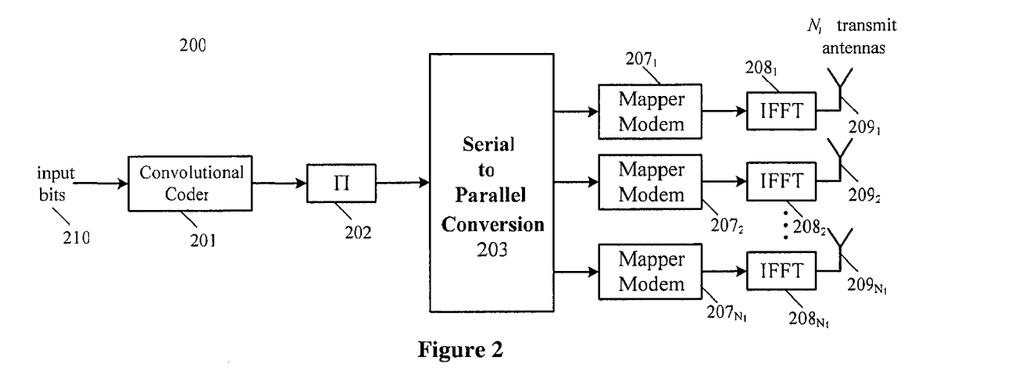
FIG. 2 is a block diagram of one embodiment of a transmitter for space-time coding with bit-interleaved coded modulation (BICM) with OFDM modulation for wideband frequency selective channels.
Figure 3:
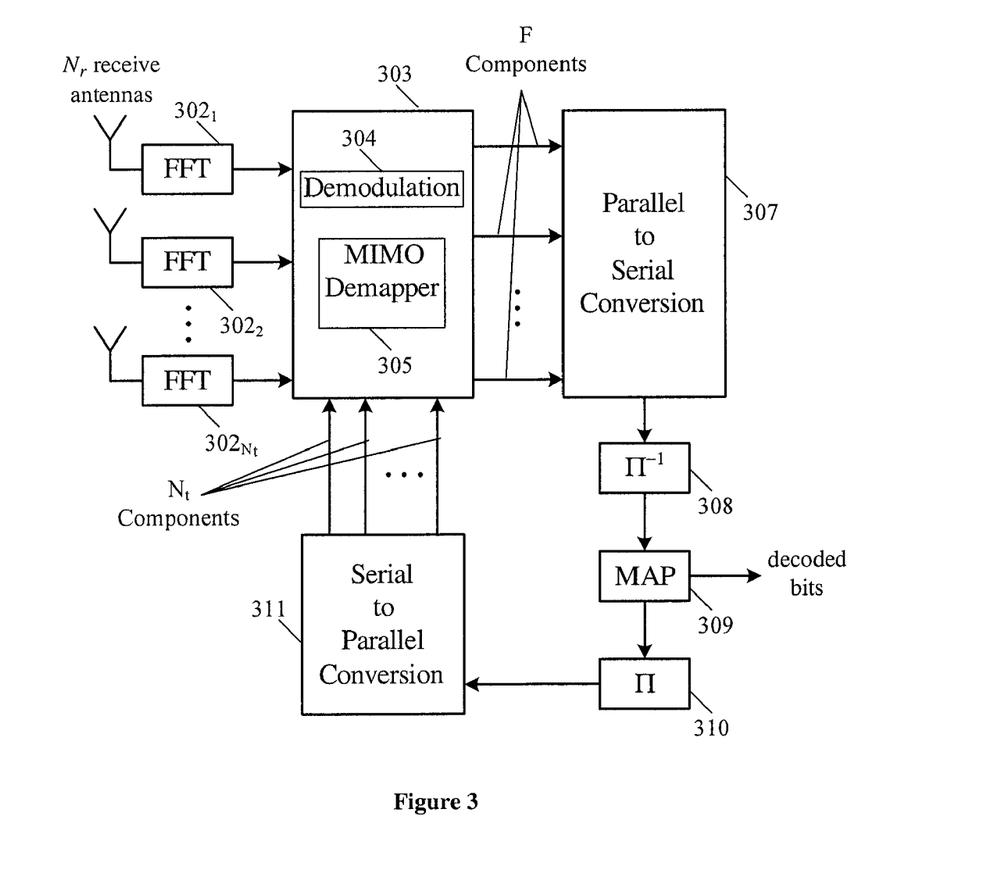
FIG. 3 is a block diagram of one embodiment of a receiver having an iterative decoder for the space-time code for the OFDM system.

FIGS. 2 and 3 show the transmitter and receiver block diagrams for a MIMO/OFDM system with BICM and ID. More specifically, FIG. 2 is a block diagram of one embodiment of a transmitter for space-time coding with bit-interleaved coded modulation (BICM) with OFDM modulation for wideband frequency selective channels. Referring to FIG. 2, transmitter 200 comprises convolutional encoder 201, bit interleaver 202, serial-to-parallel converter 203, mapper modems $207_1$-$207_{N_t}$, inverse fast Fourier transform (IFFT) modules $208_1$-$208_{N_t}$, and transmit antennas $209_1$-$209_{N_t}$. Note that IFFT module $208_1$-$208_{N_t}$ also include a circular-prefix operations, which are performed in a manner that is well-known in the art.

To perform BICM encoding to the data, convolutional coder 201 applies a binary convolutional code to the input bits (input data) 210. Bit interleaver 202 then interleaves the encoded bits from convolutional coder 201 to generate BICM encoded data. This bit interleaving de-correlates the fading channel, maximizes diversity, removes correlation in the sequence of convolutionally encoded bits from convolutional coder 201, and conditions the data for increased performance of iterative decoding. Convolutional coder 201 and bit interleaver 202 may typically operate on distinct blocks of input data, such as data packets.

After performing BICM encoding, OFDM is applied to the BICM encoded data. Serial-to-parallel converter 203 receives the serial BICM encoded bitstream from bit interleaver 202. Note that serial-to-parallel converter 203 may include a framing module (not shown) to insert framing information into the bitstream, which allows a receiver to synchronize its decoding on distinct blocks of information. Serial-to-parallel converter 203 generates a word of length $N_t$ long, with each element of the word provided to a corresponding one of mapper modems $207_1$-$207_{Nt}$. Elements of the word may be single bit values, or may be B bit values where B is the number of bits represented by each modem constellation symbol.

Each of mapper modems $207_1$-$207_{Nt}$ convert B bits to corresponding symbols (of the Q-ary symbol space, with $Q=2^B$). The output of each modem mapper 207 is a symbol. Each of IFFT modules $208_1$-$208_{Nt}$ collect up to F symbols, and then apply the IFFT operation of length F to the block of F symbols. F is an integer whose value can typically range from as small as 64 to 4096, or larger and depends on the available transmission bandwidth, the carrier frequency, and the amount of Doppler shifts that need to be accommodated by the system. Thus, each of IFFT modules $208_1$-$208_{Nt}$ generate F parallel subchannels that may be transmitted over corresponding antennas $209_1$-$209_{Nt}$. Each subchannel is a modulated subcarrier that is transmitted to the channel.

FIG. 3 is a block diagram of one embodiment of a receiver having an iterative decoder for the space-time code for the OFDM system. Referring to FIG. 3, receiver 300 comprises receive antennas $301_1$-$301_{Nr}$, fast Fourier transform (FFT) modules $301_1$-$301_{Nr}$, demodulator/detector 303, parallel-to-serial converter 307, bit deinterleaver 308, maximum a posteriori (MAP) decoder 309, bit interleaver 310, and serial-to-parallel converter 311. Although not shown, each of the FFT modules $301_1$-$302_{Nr}$ is preceded by front end that performs filtering, band-rate sampling, and a circular-prefix-removal operation.

For a wideband system, receiver 300 performs OFDM demodulation for each of receive antennas $301_{1-Nr}$, and the demodulation and demapping is performed over F parallel subchannels. The ith receive antenna 301(i) senses a signal made up of various contributions of the signals transmitted from the $N_t$ transmit antennas (i.e., contributions of the multiple F parallel, narrowband, flat fading subchannels transmitted over corresponding antennas $209_1$-$209_{Nt}$ of FIG. 2). Each of FFT modules $301_1$-$301_{Nr}$ apply an F-point FFT to the corresponding signals of receive antennas $301_1$-$301_{Nr}$, generating $N_r$ parallel sets of F subchannels.

In one embodiment, demodulator/detector 303 estimates bits in each of the F subchannels (slowly varying with flat fading) rather than in only one subchannel as in the narrowband, flat fading systems of the prior art. Demodulator 304 demodulates F subchannel carriers to baseband for each of the $N_r$ parallel sets of F subchannels. Multi-input multi-output (MIMO) demapper 305, based on the $N_r$ parallel sets of F subchannels from FFT modules $302_1$-$302_{Nr}$, produces MAP estimates of the demapped bits (i.e, bits mapped from the constellation symbol) in each of the F subchannels from the $N_t$ antennas in the transmitter. MIMO demapper 305 produces the estimates of the demapped bits and reliability information about these bits using reliability information generated by soft-output decoding (followed by reinterleaving) by MAP decoder 309.

In one embodiment, MIMO demapper 305 computes soft values for bits transmitted on the overlapping F subchannels, along with an estimate (approximation) of the posteriori probability of the soft value being correct. This is performed in a manner well-known in the art.

In one embodiment, MIMO demapper 305 considers all combinations of overlapping bits in a subchannel and then evaluates each combination.

Figure 4:
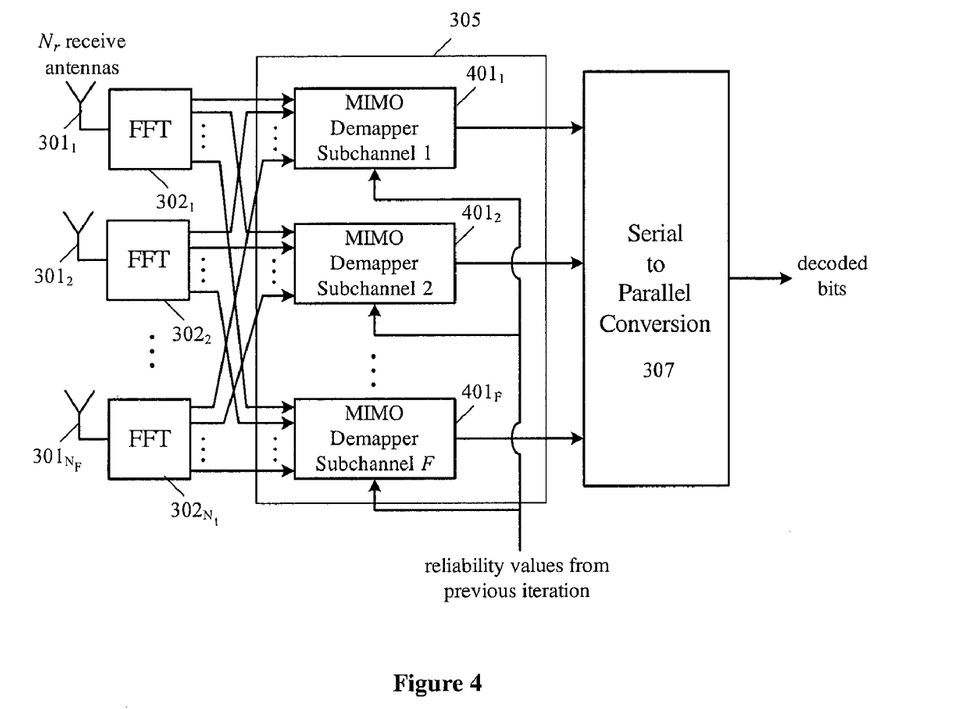
FIG. 4 is a block diagram of one embodiment of MIMO demapper 305 having MIMO joint demapper units for the different OFDM tones/subchannels.

FIG. 4 is a block diagram of one embodiment of MIMO demapper 305 having MIMO joint demapper units for the different OFDM tones/subchannels. Referring to FIG. 4, each signal of the $N_r$ receive antennas $301_1$-$301_{Nr}$ is divided into F subchannels (via demodulator 304, not shown in FIG. 4) by applying the FFT and sent to corresponding subchannel MIMO demappers $401_1$-$401_F$. The signal outputs of the kth subchannel for all $N_r$ receive antennas are provided to the kth subchannel MIMO demapper 401(k), reliability information using extrinsic information generated from the output of MAP decoder 309 of the previous iteration. The extrinsic information is exchanged between MIMO demapper 305 and MAP decoder 309 to improve the bit error rate performance for each iteration in a manner well-known in the art.

Returning to FIG. 3, the estimates of bits in F parallel streams from MIMO demapper 305 together with reliability values for those bits are provided to parallel-to-serial converter 307 which reconstitutes the estimate of the BICM encoded bitstream generated by the transmitter, which was estimated by the receiver 300. The estimated BICM encoded bitstream is then deinterleaved by bit deinterleaver 308 and applied to MAP decoder 309 to decode the information-bearing signal (this is the decoder that is associated with the convolutional encoding applied by the transmitter).

Map decoder 309 performs the MAP decoding process to generate soft output values for transmitted information bits in a manner well-known in the art. By performing an iterative process with MIMO demapper 305, the soft output values may become more reliable.

The extrinsic information from MAP decoder 309 is first applied to bit interleaver 310. Bit interleaving aligns elements of the extrinsic information with the interleaved estimated BICM encoded bitstream from MIMO demapper 305. In addition, the interleaved extrinsic information is applied to serial-to-parallel converter 311, which forms $N_t$ parallel streams of extrinsic information corresponding to the parallel bit streams formed at the transmitter.

The extrinsic information is exchanged between MIMO demapper 305 and MAP decoder 309 to improve the bit error rate performance for each iteration, in a manner that is well-known in the art. In one embodiment, an improved Max-Log approximation for calculation of LLRs is used in both MIMO demapper 305 and in MAP decoder 309 for the convolutional code. The Max-Log approximation for calculation of a posteriori LLR values may employ the max* term relationship of the following equation:

$$\max^*(x,y) = \log(e^x + e^y) = \max(x,y) + \log(1 + e^{-|x-y|})$$

when calculating updated forward recursive, reverse recursive, and branch metrics sequences to calculate the LLR. Each constituent MIMO demapper 305 or MAP decoder 309 thus calculates the max* term by separate calculation of a max term (max(x,y)) and a logarithmic correction term (log ($1+e^{-|x-y|}$)), which is the correction term. In the MaxLog-MAP, improved MaxLogMAP and MAP, two "aggregate effect" terms are computed and their difference is formed. For each "aggregate effect" term, the MAP uses all the terms, the MaxLogMAP uses the "best" term (i.e., one term only) and the improved MaxLogMAP uses the best K terms. In this example K=2, and what is shown is an efficient way to perform the calculation that is needed to include the two best terms in each of the two "aggregate effect" terms.

Figure 5:
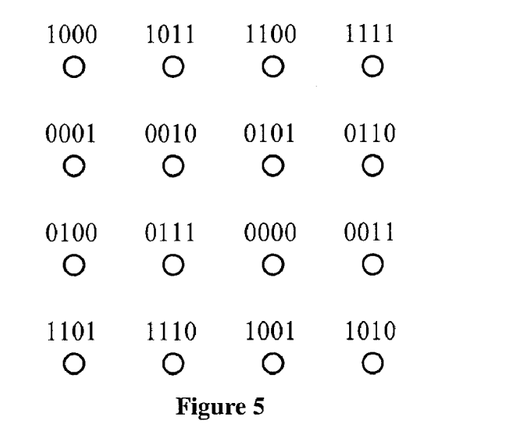
FIG. 5 illustrates one embodiment of a so called set partition type mapper.

FIG. 5 illustrates one embodiment of a so called set partition type mapper for 16 QAM for use in iterative decoding. This is used for mapping the bit-interleaved coded data into symbols.

Note that, in one embodiment, the processing of data occurs in only one iteration. In such a case, soft outputs are produced by an inner adaptive MaxLogMAP decoder and passed to a simpler outer decoder, which in this case only produces hard outputs.

Note that the techniques described herein for a low complexity receiver need not be limited to a system employing OFDM modulation.

Figure 6:
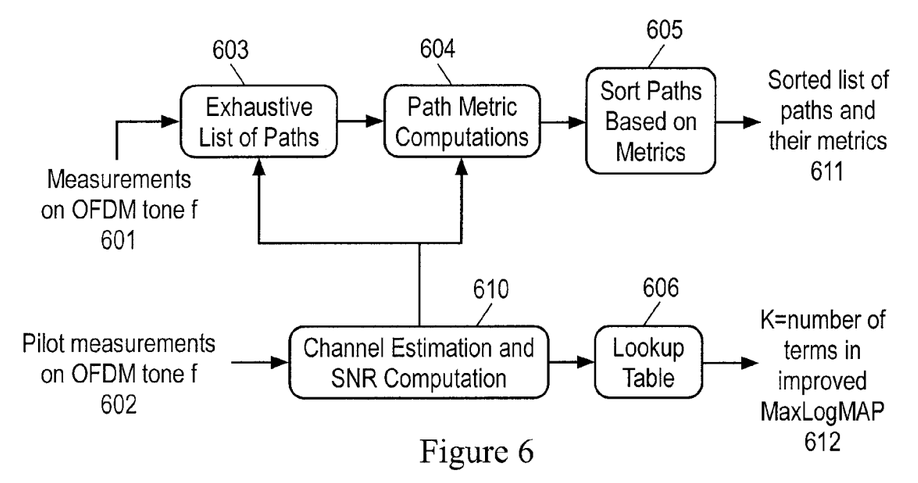
FIG. 6 is a flow diagram of one embodiment of a process for determining the sorted lists of paths and the number of terms to be used for bit value estimation and soft-output calculations.

FIG. 6 is a flow diagram of one embodiment of a process for determining the sorted lists of paths and the number of terms to be used. The process is performed by processing logic that may comprise hardware (e.g., circuitry, dedicated logic, etc.), software (such as is run on a general purpose computer system or a dedicated machine), or a combination of both.

Referring to FIG. 6, the process begins using pilot (test) measurements on OFDM tone f (602) to compute channel estimates and perform a signal to noise ratio (SNR) computation (610). Based on the SNR (or other signal level quality indication) input to lookup table (606), the lookup table (606) generates the number K representing the number of terms to be used in the improved MaxLogMAP (612).

The channel estimates and SNR computation are inputs into the list of paths generation block (603) and the path metric computation block (604). When processing a regular (non-test) signal, measurements on OFDM tone f (601) are used to determine a list of paths (603) and their metrics in a manner well-known in the art. Metrics are computed for each of the paths in the list (604) in a manner well known in the art. After calculating path metrics, the paths are sorted based on their metrics (605) to produce a sorted list of paths and their metrics (611). The sorted list of paths and their metrics (611) and K (612) are inputs into the process of FIG. 7.

Figure 7:
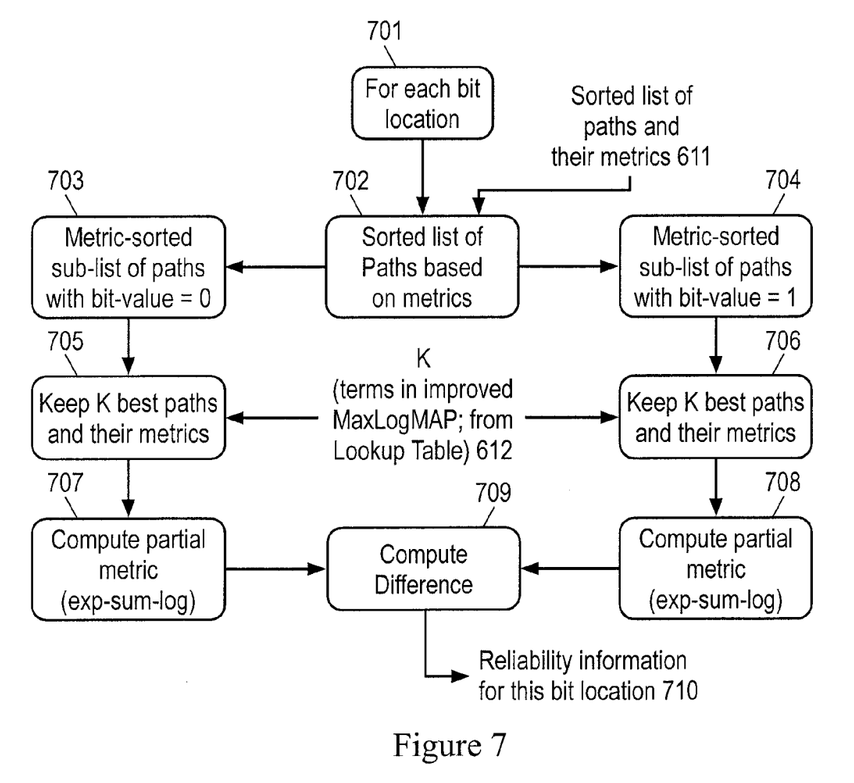
FIG. 7 is a flow diagram of one embodiment of a process for determining the reliability (soft output) information for a bit location.

FIG. 7 is a flow diagram of one embodiment of a process for determining the liability information for a bit location. The process is performed by processing logic which may comprise hardware (e.g., circuitry, dedicated logic, etc.), software (such as is run on a general purpose computer system or a dedicated machine), or a combination of both.

Referring to FIG. 7, the process has a bit location 701, the sorted lists of paths and their metrics (611) for that bit location and the number K from the lookup table (606) as inputs. For each bit location (701), processing logic sorts the list of paths based on their metrics (702) into two sublists, one sublist for the paths that have the bit value equal to one (704) and another sublist for paths with the bit-value equal to zero (703) at the given bit location. From both sublists 703 and 704, the K best path and their metrics are selected (705, 706). Then, from the K best paths and their metrics for both the sublists where the bit value equals zero and the bit value equals one, partial metrics are computed at processing blocks 707 and 708, respectively. After the partial metrics are computed for the K best paths for bit value equal to zero and for bit value equal to one, a difference is computed between the results of the computation (709). The difference represents the reliability information for this bit location (710).

Advantages of Embodiments of the Invention

One advantage of embodiments of the invention is that it can provide near-MAP MIMO detector performance with adaptive allocation of complexity resources beyond the basic MaxLogMAP detector as described above. Embodiments of the invention are applicable to any MIMO/OFDM system with BICM/ID where the number of transmit antennas and the number of bits per QAM signal point is moderate as described above. A proposed 4 G system with N=4 transmit antennas and 16 QAM, i.e. b=4 bits per signal point will generate approximately 64000 candidates in the exhaustive search in the MaxLogMAP. This operation has to be performed at every iteration and for every tone.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

We claim:

1. A device for use in a wireless communication system having a transmitter, the device comprising:
a receiver to receive information-bearing signals from the transmitter wirelessly transmitted using OFDM and bit interleaved coded modulation, the receiver comprising an inner decoder structure having a multiple-in multiple-out (MIMO) joint demapper to perform most likely transmitted symbol estimation using a modified MaxLogMAP process that is operable to adapt a degree of metric correction based on quality of OFDM tones, including adapting a number of correction terms in a MaxLogMAP metric based on the quality of OFDM tones such that the modified MaxLogMAP algorithm uses more correction terms in the MaxLogMAP metric for OFDM tones with quality below the first level than the MaxLogMAP uses for OFDM tones with quality above the first level.

2. The device defined in claim 1 wherein the inner decoder structure is operable to adapt the number of iterations based on the quality of different OFDM tones.

3. The device defined in claim 1 wherein the modified MaxLogMAP process performed by the inner decoder structure uses one or more additional terms with respect to MaxLogMAP in detection and in computing soft information.

4. The device defined in claim 1 wherein the demapper of inner decoder structure comprises an improved MaxLogMAP detector, and the receiver further comprises an outer decoder communicably coupled to receive the output from the inner decoder structure and generate a soft output.

5. The device defined in claim 4 wherein the outer decoder comprises a BCJR decoder.

6. The device defined in claim 4 wherein the outer decoder is operable to generate feedback information to the inner decoder structure for use in iterative decoding.

7. The device defined in claim 4 wherein the outer decoder comprises a soft-input hard-output decoder for use without iterative decoding.

8. The device defined in claim 7 wherein the soft-input hard output decoder comprises a Viterbi decoder.

9. The device defined in claim 1 wherein the quality of OFDM tones is based on signal level.

10. The device defined in claim 1 wherein the quality of OFDM tones is based on signal-to-noise ratio (SNR).

11. A device for use in a wireless communication system having a transmitter, the device comprising:
a receiver to receive information-bearing signals from the transmitter wirelessly transmitted using OFDM and bit interleaved coded modulation, the receiver comprising an inner decoder structure having a multiple-in multiple-out (MIMO) joint demapper to perform most likely transmitted symbol estimation using a modified MaxLogMAP process that is operable to adapt a degree of metric correction based on quality of OFDM tones, including adapting a number of correction terms in a MaxLogMAP metric based on the quality of OFDM tones,
wherein the receiver further comprises:
a plurality of antennas;
a plurality of fast Fourier transform (FFT) modules, each of the plurality of FFT modules coupled to receive signals from one of the plurality of antennas; and
a binary outer decoder to decode a first set of data output by the demapper to produce output data from the receiver; and wherein the demapper comprises an inner symbol demapper that operates using an improved MaxLogMAP detector.

12. The device defined in claim 11 wherein the outer decoder comprises soft-output decoder for a convolutional code.

13. The device defined in claim 11 wherein the outer decoder comprises one of a group consisting of decoders for a rate-compatible punctured convolutional (RCPC) code, a turbo code and a LDPC code.

14. A method comprising:
evaluating quality of individual OFDM tones received by a receiver in a wireless communication system; and
performing a first decoding operation to produce a first set of output data representing most likely transmitted bit estimation values and information about the reliability of each of these estimates, including
performing soft-output decoding using a MaxLogMAP on OFDM tones with quality higher than a first level, and
performing decoding using a modified MaxLogMAP algorithm on OFDM tones with quality below the first level by adding one or more correction terms to a MaxLogMAP metric, such that the modified MaxLogMAP algorithm uses more correction terms in the MaxLogMAP metric for OFDM tones with quality below the first level than the MaxLogMAP uses for OFDM tones with quality above the first level.

15. The method defined in claim 14 wherein performing decoding using a modified MaxLogMAP algorithm comprising:
performing an exhaustive distance-metric calculation;
maintaining a predetermined number of two or more smallest distance values during the exhaustive distance-metric calculation; and
calculating a modified log likelihood ratio value using the predetermined number of smallest distance values.

16. The method defined in claim 15 further comprising selecting the predetermined number adaptively based on the quality of the OFDM tones.

17. The method defined in claim 14 further comprising selecting a number of iterations for a given tone adaptively based on the quality of the individual OFDM tones.

18. The method defined in claim 14 further comprising adapting use of the one or more correction terms to compute and add to a MaxLogMAP metric to different OFDM blocks in a time sequence.

19. The method defined in claim 14 further comprising adapting a number of iterations to different OFDM blocks in a time sequence.

20. The method defined in claim 14 wherein the quality of OFDM tones is based on signal level.

21. The method defined in claim 14 wherein the quality of OFDM tones is based on signal-to-noise ratio (SNR).

22. The method defined in claim 14 further comprising performing a second decoding operation with an outer decoder.

23. The method defined in claim 22 wherein the binary outer decoder comprises a convolutional decoder.

24. The method defined in claim 22 wherein the binary outer decoder comprises one of a group consisting of decoders for a rate-compatible punctured convolutional (RCPC) code, a turbo code and a LDPC code.

* * * * *